United States Patent [19]

Tsurumaru

[11] 4,206,412
[45] Jun. 3, 1980

[54] TRAP CIRCUIT FOR BLOCKING SPURIOUS SIGNALS FROM A T.V. INTERMEDIATE FREQUENCY AMPLIFIER

[75] Inventor: Shinobu Tsurumaru, Yokohama, Japan

[73] Assignee: Sony Corporation, Tokyo, Japan

[21] Appl. No.: 928,461

[22] Filed: Jul. 27, 1978

[30] Foreign Application Priority Data

Jul. 27, 1977 [JP] Japan .................. 52-90125

[51] Int. Cl.² .................. H04B 1/10; H04B 15/00; H04N 5/44
[52] U.S. Cl. .................. 455/307; 358/167; 455/311
[58] Field of Search .............. 325/436, 437, 472, 477, 325/479, 483, 489, 379, 383, 385, 388; 358/167

[56] References Cited

U.S. PATENT DOCUMENTS 2,204,954  6/1940  Anderson et al. .................. 325/479
3,416,086  12/1968  Carlson .................. 325/479

Primary Examiner—Marc E. Bookbinder
Attorney, Agent, or Firm—Lewis H. Eslinger; Alvin Sinderbrand

[57] ABSTRACT

A tuner for use with a television receiver includes a mixer receiving and mixing radio frequency and local oscillator signals and a low-pass peaking circuit for preferentially coupling the intermediate frequency from the mixer to an intermediate frequency amplifier. A capacitor in parallel with a series combination of an inductor and a capacitor in the peaking circuit forms a trap circuit for blocking spurious high-frequency signals from the intermediate frequency amplifier. An emitter follower between the mixer and the intermediate frequency amplifier may be included within the parallel connection.

9 Claims, 6 Drawing Figures

TRAP CIRCUIT FOR BLOCKING SPURIOUS SIGNALS FROM A T.V. INTERMEDIATE FREQUENCY AMPLIFIER

BACKGROUND OF THE INVENTION

1. Field of the Invention

This invention relates generally to a tuner for use with a television receiver, and more particularly to a tuner for use with a television tuner which is provided with an improved mixer so as to avoid a beat component.

2. Description of the Prior Art

In the art, when a specified television channel is received by a television receiver, the mixer circuit of the tuner in the television receiver may produce a beat component in the intermediate frequency band due to the relationship between certain carrier frequencies and local oscillation frequencies. Hence a beat interference appears on the picture screen of the television receiver. This is a special problem in the USA because of certain frequency allocations and television standards.

United States standards place the video intermediate frequency at 45.75 MHz and the voice intermediate frequency at 41.25 MHz. When turning channel 6 which as a video carrier frequency $f_{P6}$ at 83.25 MHz and a voice carrier frequency $f_{S6}$ at 87.75 MHz, the local oscillation frequency $f_{L6}$ is 129 MHz. A so-called 6 channel beat is produced which fall within the intermediate frequency band. The channel 6 beat is produced as follows:

$$(f_{P6} + f_{S6}) - f_{L6} = 171 \text{ MHz} - 129 \text{ MHz}$$
$$= 42 \text{ MHz}$$

Also, when receiving channel in an area where channel 5 is also broadcast, since the video carrier frequency $f_{P5}$ of channel 5 is 77.25 MHz and the channel 4 local oscillation frequency $f_{L4}$ is 113 MHz, a so-called channel 4 beat is produced which falls within the intermediate frequency band. The channel 4 beat is produced as follows:

$$2f_{P5} - f_{L4} = 154.5 \text{ MHz} - 113 \text{ MHz}$$
$$= 41.5 \text{ MHz}$$

An example of a prior art wide band mixer circuit is shown in FIG. 1. In the prior art mixer circuit shown in FIG. 1, a radio frequency signal and a local oscillation signal are applied to an input terminal 1, and are then mixed in a transistor 2 to produce sum and difference frequencies including an intermediate frequency signal. The intermediate frequency signal is amplified during mixing in transistor 2 and then applied through an emitter follower transistor 3 to a low pass peaking circuit 5 formed of a capacitor 4, a coil 8 and a capacitor 9. The peaking circuit 5 serves to pass the signals in intermediate frequency range of from 41 to 47 MHz and to reject the passage of spurious sum and difference signals outside the intermediate frequency range which exist in the output from emitter follower transistor 3. The signal from the peaking circuit 5 is fed to a transistor 7 for further amplifications and is then delivered to an output terminal 10. In this prior art example, the transistors 2, 3, 7 and the capacitor 9 are formed as part of an integrated circuit to which only the capacitor 4 and the coil 8 are externally connected.

The prior art wide band mixer circuit shown in FIG. 1 has the problem that production of channel 4 and channel 6 beat interference can not be positively prevented. That is, in the mixer circuit of FIG. 1, in the presence of strong input signals, emitter follower transistor 3 may be driven into non linear operation. The sum and difference frequencies in the output of mixer transistor 2 may be further mixed by this non linear operation to produce the above-mentioned beat interference. Since the beat interference generated by non-linear operation of transistor 3 is within the intermediate frequency range, the peaking circuit 5 is ineffective to block it.

The attenuation characteristic of the peaking circuit 5 is not very sharp as shown in the graph of FIG. 4 by a one-dot chain line curve 14a. Therefore, spurious signal components from either transistor 2 or 3 which have frequencies higher than the intermediate frequency band such as $f_{P6} + f_{S6}$, $f_{L6}$, $2f_{P5}$ and $f_{L4}$, are not strongly attenuated.

These high frequency spurious signals are applied at rather high levels to the base of transistor 7. These spurious signals can drive transistor 7 into non-linear operation and hence the above-mentioned beat is produced. The beat interference ratio characteristic of the prior art mixer circuit of FIG. 1 is shown in the graph of FIG. 6 by a one-dot chain line curve 16a. The beat interference ratio is defined as the intermediate frequency signal voltage/beat signal voltage.

OBJECTS AND SUMMARY OF THE INVENTION

Accordingly, it is an object of the present invention to provide a novel tuner for use with a television receiver.

It is another object of the invention to provide a tuner for use with a television receiver which prevents a novel mixer circuit so as to prevent the generation of the beat component.

It is a further object of the invention to provide a tuner with a peaking circuit having a trap circuit which prevents generation of the beat component.

According to an aspect of the present invention there is provided a tuner which comprises an input terminal supplied with a radio frequency signal and a local oscillator signal, followed by mixing means having an emitter follower for producing an intermediate frequency signal, the mixing means is supplied with an input signal from said input terminal; an amplifying transistor for amplifying said intermediate frequency signal, and a peaking circuit including an inductance connected between a terminal of said mixing transistor and an input of said amplifying transistor and a first capacitor connected between the input of said amplifying means and a reference potential, characterized in that said tuner further comprises a second capacitor connected in parallel to said inductance equivalently for forming a trap circuit with said inductance.

The additional, and other objects, features and advantages of the present invention will be apparent from the following description taken in conjunction with the accompanying drawings through which the like references designate the like elements.

DESCRIPTION OF THE PREFERRED EMBODIMENTS

Figure 1:
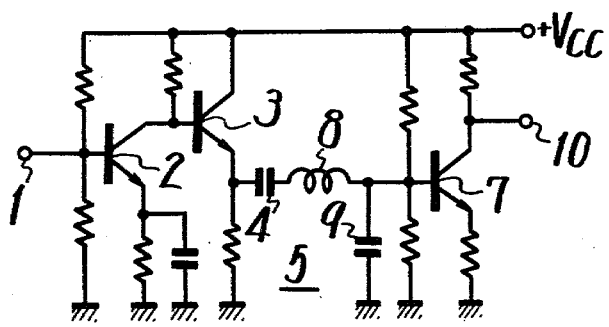
FIG. 1 is a schematic diagram showing an example of a prior art wide band mixer circuit.

An example of the tuner according to the present invention is described with reference to FIG. 2. An untuned mixer circuit 11 comprises a mixing transistor 22 with associated resistors. A radio frequency signal and a local oscillation singal, from sources not shown are supplied through an input terminal 21, to the base of transistor 22. Mixer transistor 22 operates non linearly to mix and amplify the applied signals and to produce an intermediate frequency signal plus spurious sum and difference frequencies of the applied signals. An intermediate frequency amplifying circuit 12 includes transistors 27, 28 and 29 and feeds an output terminal 30. The output of the mixer circuit 11 is connected from the collector of the transistor 22 to intermediate frequency amplifying circuit 12 at the base of the transistor 27 through an emitter follower transistor 23, a capacitor 24 and a low pass peaking circuit 25. The peaking circuit 25 consists of an inductance $L_p$ and a capacitance $C_p$. Capacitance $C_p$ may be the input capacitance of about 10 to 12 $_pF$, which exists between the base of the transistor 27 and the substrate of an integrated circuit. A capacitor 26 is connected in parallel to the inductance $L_p$ of the peaking circuit 25 to form a parallel resonant trap circuit. The peak frequency of the peaking circuit 25 is selected in the vicinity of the intermediate frequency, while the trap frequency of the trap circuit consisting of the inductance $L_p$ and the capacitor 26 is selected higher than the peak frequency to attenuate the spurious signals above the intermediate frequency.

Figure 4:
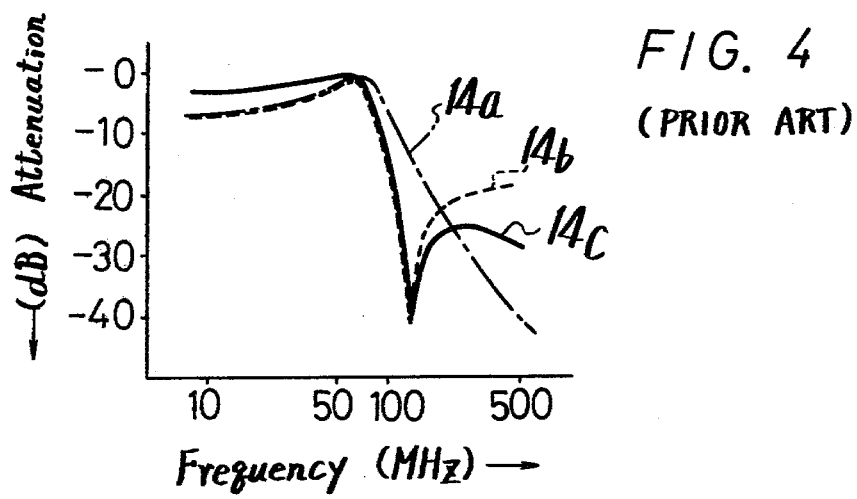
FIGS. 4 to 6 are graphs used for explaining the characteristics of the tuners of the prior art and the present invention.
Figure 6:
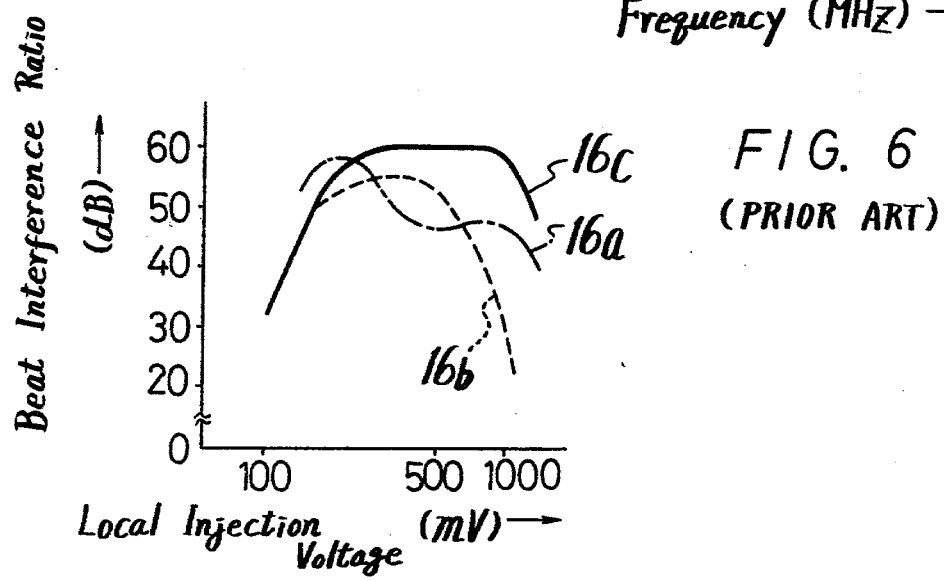

The peaking circuit 25 including capacitor 26 has an attenuation characteristic shown in the graph of FIG. 4 by dotted line curve 14b. It is apparent from curve 14b that the spurious signal component, which has a frequency higher than the intermediate frequency bands such as $f_{P6}+f_{S6}$, $f_{L6}$, $2f_{P5}$ and $f_{L4}$ is strongly attenuated. Therefore, high frequency sum and difference frequencies can be prevented from reaching the intermediate frequency amplifying circuit 12 where they may be mixed to generate beat interference. A dotted line curve 16b in the graph of FIG. 6 shows the beat interference ratio characteristic of the tuner of the invention shown in FIG. 2.

Figure 2:
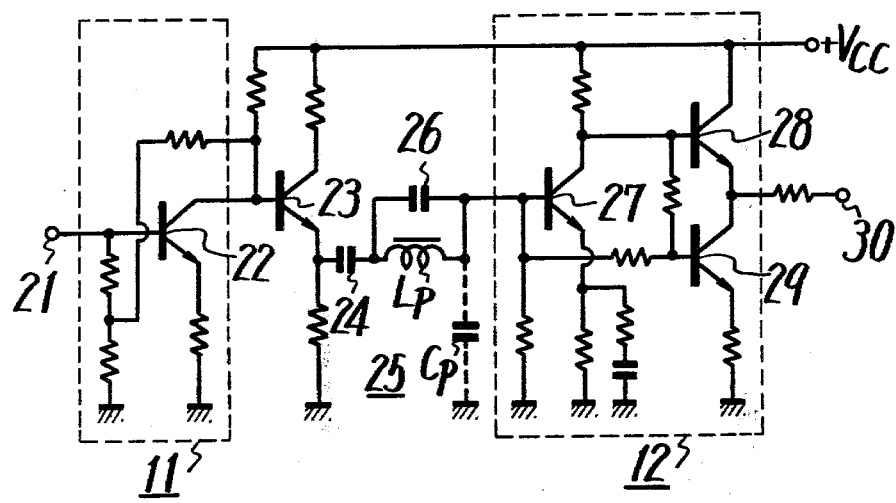
FIGS. 2 and 3 are schematic diagrams respectively showing embodiments of the tuner according to the present invention.

With the tuner of the invention shown in FIG. 2, however, similar to the prior art mixer shown in FIG. 1, generation of the beat in emitter follower transistor 23 configuration may not be prevented sufficiently. The load impedance $|Z_L|$ looking toward the intermediate frequency amplifying circuit 12 from the emitter of the transistor 23 is as indicated by a dotted line curve 15b in the graph of FIG. 5. The load impedance $Z_L$ is low for the intermediate frequency and also for the frequencies such as $f_{P6}+f_{S6}$, $f_{L6}$, $2f_{P5}$ and $F_{L4}$ which all are above 100 MHz. A large current may flow through the transistors 23 due to its low impedance. This makes its dynamic range small and hence non-linear operation is caused in transistor 23. This non-linear operation mixes the sum and difference frequencies generated by mixer transistor 22 to produce the above beat component. When the beat component is produced in the transistor 23 in this fashion, the beat component falls within the intermediate frequency band and is supplied to the intermediate frequency amplifying circuit 12 without being attenuated by the peaking circuit 25 even when the peaking circuit 25 has the trap characteristic as set forth above.

Figure 3:
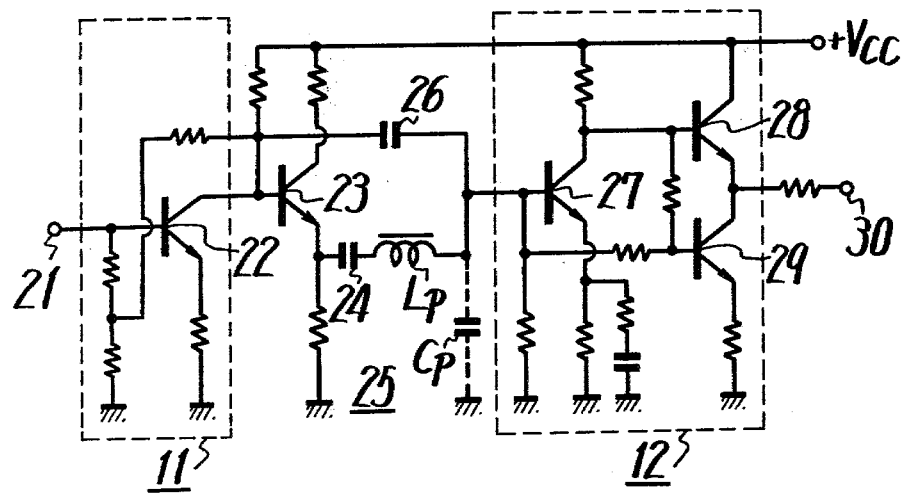

FIG. 3 is a schematic diagram showing another embodiment of the present invention which solves the problem encounted in the example of FIG. 2 set forth just above. In the embodiment of FIG. 3, the capacitor 26 is not directly connected in parallel to the inductance element $L_p$ but is connected thereto in parallel with the series combination of capacitor 24 and inductance element $L_p$ through the base-emitter path of the transistor 23. In this case, the capacitor 26 may conveniently be made part of the integrated circuit. The remainder of the embodiment shown in FIG. 3 is substantially same as that of FIG. 2, so that the other elements shown in FIG. 3 are marked with the same reference numerals and letters as those of FIG. 2 and their description will be omitted.

Figure 5:
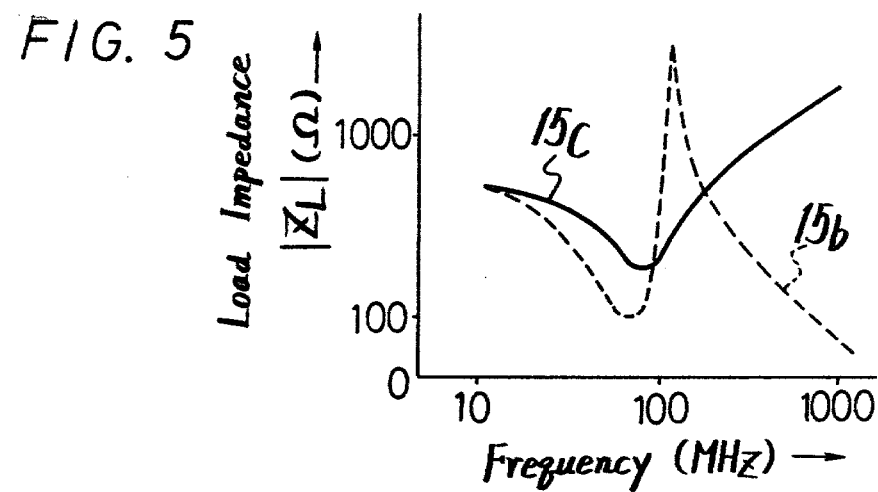

According to the example of the invention shown in FIG. 3, the load impedance $|Z_L|$ looking toward the intermediate frequency amplifying circuit 12 from the emitter of the emitter follower transistor 23 is as shown by a solid line curve 15c in the graph of FIG. 5. That is, the load impedance $|Z_L|$ of this example is higher through the intermediate frequency and also remains quite high for frequencies of $f_{P6}+f_{S6}$, $f_{L6}$, $2f_{P5}$ and $f_{L4}$. Therefore, a current flowing through the transistor 23 becomes small and hence its dynamic range becomes great. As a result, non-linear operation and consequent generation of beats in the transistor 23 is avoided.

A solid line curve 14c in the graph of FIG. 4 shows the attenuation characteristic of the peaking circuit 25 in the example of FIG. 3, and a solid line curve 16c in the graph of FIG. 6 shows the beat interference ratio characteristic of the example shown in FIG. 3, from which it will be apparent that the beat interference ratio characteristic is improved over a wide range of the injected voltage of the local oscillator.

It will be apparent that many modifications and variations could be effected by one skilled in the art without departing from the spirits or scope of the novel concepts of the present invention, so that the scope of the invention should be determined by the appended claims.

I claim as my invention:

1. A circuit comprising:
    an input terminal supplied with a radio frequency signal and a local oscillator signal;
    mixing means including a transistor connected as an emitter follower for producing an intermediate frequency signal, said mixing means being supplied with an input signal from said input terminal;
    intermediate frequency amplifying means for amplifying said intermediate frequency signal;
    a peaking circuit including a first capacitor having first and second terminals, an inductance having first and second terminals, said first terminal of said first capacitor being connected to said first terminal of said inductance, said second terminal of one of said inductance and said first capacitor being connected to a terminal of said mixing means and the other of said second terminals of said inductance and said first capacitor being connected to an input of said intermediate frequency amplifying means and a second capacitor connected between said input of said intermediate frequency amplifying means and a reference potential; and a third capacitor connected in parallel to at least said inductance for equivalently forming a trap circuit at least with said inductance.

2. A circuit comprising:

an input terminal supplied with a radio frequency signal and a local oscillator signal;

mixing means including a transistor connected as an emitter follower for producing an intermediate frequency signal, said mixing means being supplied with an input signal from said input terminal;

intermediate frequency amplifying means for amplifying said intermediate frequency signal;

a peaking circuit including a first capacitor in series with an inductance connected between a terminal of said mixing means and an input of said intermediate frequency amplifying means and a second capacitor connected between said input of said intermediate frequency amplifying means and a reference potential; and a third capacitor connected between an input of said emitter follower transistor and said input of said intermediate frequency amplifying means whereby it is in parallel through the base-emitter junction of said emitter follower transistor with said series combination of said first capacitor and said inductor for equivalently forming a trap circuit therewith.

3. A circuit according to claim 2, wherein a peaking frequency of said peaking circuit is equal to an intermediate frequency.

4. A circuit according to claim 3, wherein a resonant frequency of said trap circuit is higher than said intermediate frequency.

5. A circuit comprising:

a mixer transistor having an input for receiving radio frequency and local oscillator signals, and an output;

an emitter follower transistor having an output and an input connected to said output of said mixer transistor;

an intermediate frequency amplifier having an input and an output;

a peaking circuit connecting said output of said emitter follower transistor to said input of said intermediate frequency amplifier;

said peaking circuit including an inductor in series with a first capacitor between said output of said emitter follower transistor and said input of said intermediate frequency amplifier, a second capacitor connected from said input of the intermediate frequency amplifier to a reference potential and a third capacitor in parallel with at least said inductor and forming therewith a trap circuit.

6. A circuit comprising:

a mixer transistor having an input for receiving radio frequency and local oscillator signals, and an output;

an emitter follower transistor having an output and an input connected to said output of said mixer transistor;

an intermediate frequency amplifier having an input and an output;

a peaking circuit connecting said output of said emitter follower transistor to said input of said intermediate frequency amplifier;

said peaking circuit including an inductor in series with a first capacitor between said output of said emitter follower transistor and said input of said intermediate frequency amplifier, a second capacitor connected from said input of the intermediate frequency amplifier to a reference potential and a third capacitor in parallel with at least said inductor and forming therewith a trap circuit; and said trap circuit being effective for maintaining linear operation of said emitter follower transistor.

7. The circuit according to claim 6, wherein said emitter follower transistor has a base-emitter junction, and said third capacitor is connected in parallel with the series combination of said first capacitor and said inductor through said base-emitter junction of the emitter follower transistor.

8. The circuit according to claim 6, wherein said output of the intermediate frequency amplifier provides a signal of a predetermined intermediate frequency, and the resonant frequency of said trap circuit is higher than said intermediate frequency.

9. The circuit according to claim 8, wherein said peaking circuit has a peaking frequency equal to said intermediate frequency.